United States Patent [19]
Oki et al.

[11] Patent Number: 5,930,636
[45] Date of Patent: *Jul. 27, 1999

[54] METHOD OF FABRICATING HIGH-FREQUENCY GAAS SUBSTRATE-BASED SCHOTTKY BARRIER DIODES

[75] Inventors: Aaron K. Oki, Torrance; Donald K. Umemoto, Manhattan Beach; Liem T. Tran, Torrance; Dwight C. Streit, Seal Beach, all of Calif.

[73] Assignee: TRW Inc., Redondo Beach, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/645,361

[22] Filed: May 13, 1996

[51] Int. Cl.$^6$ .......................... H01L 21/331; H01L 21/00; H01L 21/338; H01L 31/0328
[52] U.S. Cl. ........................ 438/314; 438/31; 438/184; 257/197; 257/198; 257/474; 257/477; 257/478
[58] Field of Search .......................... 437/31, 176, 184, 437/228; 257/73, 472, 471, 197, 198, 474, 477, 478; 438/31, 184, 314

[56] References Cited

U.S. PATENT DOCUMENTS

| | | | |
|---|---|---|---|
| 4,499,656 | 2/1985 | Fabian et al. | 437/176 |
| 4,749,661 | 6/1988 | Bower | 437/33 |
| 4,943,742 | 7/1990 | Fukushima | 307/458 |
| 5,162,243 | 11/1992 | Streit et al. | 437/31 |
| 5,223,449 | 6/1993 | Morris et al. | 437/51 |
| 5,268,315 | 12/1993 | Prasad et al. . | |
| 5,324,671 | 6/1994 | Bayraktaroglu | 437/31 |
| 5,571,732 | 11/1996 | Liu | 437/31 |
| 5,616,950 | 4/1997 | Liu | 437/912 |
| 5,670,801 | 9/1997 | Nakano . | |

FOREIGN PATENT DOCUMENTS

| | | | |
|---|---|---|---|
| 60-148170 | 8/1985 | Japan | 437/176 |
| 64-077164 | 3/1989 | Japan | 437/176 |
| 1-183155 | 7/1989 | Japan . | |

OTHER PUBLICATIONS

"Diode–HBT–Logic Circuits Monolithically Integrable with ECL/CML Circuits", GaAs Ic Symposium, pp. 91–94, Mar. 1991.

"AlGa/GaAs Hetrojunction Bipolar Transistor Reliablity: Device Modeling and SPICE Simulation", 21st International Conference on Microelectronics, vol. 1, pp. 223–228, Sep. 14, 1997.

"GaAs Heterojunction Bipolar Transistor Device and IC Technology for High–Performance Analog and Microwave Applications", IEEE Transctions on Microwave Theory and Techniques, vol. 37, No. 9, pp. 1286–1303, Sep. 1989.

"Extrinsic Base Surface Passivation in GaInP/GaAs Hetrojunction Bipolar Transistors", IEEE Electron Device Letters, vol. 14, No. 6, pp. 301–303, Jun. 1993.

"Monolithic HEMT–HBT Integration by Selective MBE", IEEE Transactions on Electron Devices, vol. 42, No. 4, pp. 618–623, Apr. 1995.

"Improved Current Gain and fT Through Doping Profile Selection in Linearly Graded Heterojunction Bipolar Transistors", IEE Transactions on Electron Devices, vol. 37, No. 8, pp. 1779–1787, Aug. 1990.

"Integrated Schottky Diodes in HBT Technology", IBM Tech. Disc. Bull., vol. 31, No. 5, pp. 1–3, Oct. 1, 1988.

*Primary Examiner*—Olik Chaudhuri
*Assistant Examiner*—Alonzo Chambliss
*Attorney, Agent, or Firm*—Michael S. Yatsko

[57] ABSTRACT

A Schottky barrier diode and a method for fabricating a Schottky barrier diode that utilizes HBT active device layers. The Schottky barrier diode is formed with a vertically integrated profile on a GaAs substrate, with a subcollector layer and a collector layer. A suitable dielectric material is deposited on top of the collector layer. Vias are formed in the collector layer and subcollector layer for the barrier and ohmic contacts. The collector via is relatively deeply etched into the collector layer to lower the series resistance between the barrier and ohmic contacts, which results in relatively higher cut-off frequency performance.

15 Claims, 4 Drawing Sheets

METHOD OF FABRICATING HIGH-FREQUENCY GAAS SUBSTRATE-BASED SCHOTTKY BARRIER DIODES

BACKGROUND OF THE INVENTION

1. Field of the Invention

The present invention relates to a Schottky barrier diode and a method of fabricating Schottky barrier diodes, and more particularly to a Schottky barrier diode that utilizes heterojunction bipolar transistor (HBT) active device layers to provide a Schottky barrier diode with reduced resistance between its barrier and ohmic contacts, which results in relatively high performance and high reliability and enables the Schottky barrier diode to be relatively easily integrated with other GaAs integrated circuits to form monolithic multifunction integrated circuits.

2. Description of the Prior Art

Schottky barrier diodes are generally known in the art. Such diodes are generally used in applications, such as high-frequency sample-and-hold amplifiers and analog-to-digital converters. Schottky barrier diodes are also used in various microwave and millimeter wave applications.

Schottky barrier diodes are known to be made from various processes. For example, some known Schottky barrier diodes are fabricated from silicon processes. Schottky barrier diodes formed from silicon processes are known to have relatively poor performance due to minority carrier injection from the lower silicon Schottky barrier. Silicon processing is also known to yield Schottky barrier diodes with relatively high-parasitic capacitances. As such, Schottky barrier diodes fabricated from silicon are known to provide poor performance in some applications, while unsuitable for other applications.

Schottky barrier diodes are also known to be formed from heterojunction bipolar transistor (HBT) processing techniques, which utilize a GaAs substrate. An example of an HBT process for fabricating a Schottky barrier diode is disclosed in copending application Ser. No. 08/556,321, filed on Nov. 8, 1995, entitled "METHOD OF FABRICATING MONOLITHIC MULTIFUNCTION INTEGRATED CIRCUIT DEVICES", by C. Streit, D.K. Umemoto, A.K. Oki and K. Kobayashi, assigned to the same assignee as the present invention and hereby incorporated by reference. In that application, an n+ subcollector layer is epitaxially grown on a GaAs substrate. An n− collector layer is subsequently epitaxially grown on top of the subcollector layer and etched to form a collector mesa. A barrier contact is formed on top of the collector mesa, while an ohmic contact is formed on the subcollector layer, adjacent the collector mesa.

In the above-mentioned copending application, the Schottky barrier diode is integrated onto the same wafer with an HBT. As such, the subcollector layer of the Schottky barrier diode is formed with generally the same thickness as the subcollector layer of the HBT. As such, the current path and thus the series resistance between the barrier and ohmic contacts is relatively high, resulting in lower-than-desired cut-off frequency performance.

SUMMARY OF THE INVENTION

It is an object of the present invention to solve various problems in the prior art.

It is yet a further object of the present invention to provide a method for fabricating Schottky barrier diodes with relatively lower contact resistance.

It is yet another object of the present invention to provide a method for fabricating Schottky barrier diodes with relatively higher cut-off frequency performance.

It is yet a further object of the present invention to provide a method for fabricating Schottky barrier diodes that utilize heterojunction bipolar transistor (HBT) processing techniques.

Briefly, the present invention relates to a Schottky barrier diode and a method for fabricating a Schottky barrier diode that utilizes HBT active device layers. The Schottky barrier diode is formed with a vertically integrated profile on a GaAs substrate, with a subcollector layer and a collector layer. A suitable dielectric material is deposited on top of the collector layer. Vias are formed in the collector layer and subcollector layer for the barrier and ohmic contacts. The subcollector via is relatively deeply etched into the subcollector layer to lower the series resistance between the barrier and ohmic contacts, which results in relatively higher cut-off frequency performance.

BRIEF DESCRIPTION OF THE DRAWINGS

These and other objects of the present invention will be readily understood with reference to the following specification and attached drawing, wherein.

DETAILED DESCRIPTION OF THE INVENTION

FIGS. 1–10 illustrate the processing steps for fabricating a Schottky barrier diode in accordance with the present invention with reduced series resistance between barrier and ohmic contacts, which results in relatively higher cut-off performance. Schottky barrier diodes formed from the process in accordance with the present invention have demonstrated a cut-off frequency of >700 GHz with a relatively higher breakdown voltage of >10 volts. As such, Schottky barrier diodes fabricated in accordance with the present invention are suitable for use in millimeter wave mixers up to 40 GHz, as well as ultra high speed sampling bridges for sample-and-hold amplifiers.

Figure 1:
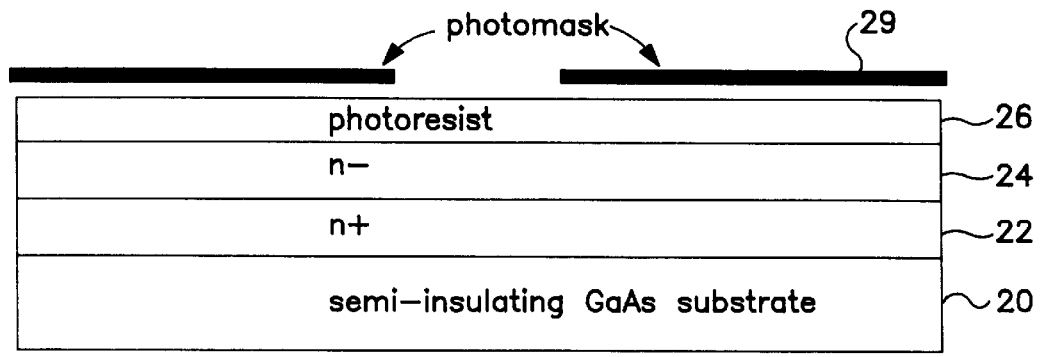
FIG. 1 is an elevational view of the epitaxial layers of the Schottky barrier diode at the beginning of the processing illustrating a photomask for defining the location of the collector via for the Schottky barrier diode contact.

Referring to FIG. 1, various active heterojunction bipolar transistor (HBT) layers are vertically integrated to form the Schottky barrier diode in accordance with the present invention. In particular, a device profile, which includes a GaAs substrate 20, a subcollector layer 22 formed from an n+ material and a collector layer 24, formed from an n− material, are vertically integrated, one on top of another. These layers 20, 22 and 24 may be formed by molecular beam epitaxy (MBE) or metal organic chemical vapor deposition (MOCVD). Exemplary thicknesses of the substrate 20, subcollector layer 22, and collector layer 24 are 25 mm, 6000 Å and 7000 Å, respectively. A photoresist 26, for example 12,000 Å, is spun on top of the collector layer 24. A photomask 27 is used to define the location of a collector via 28 (FIG. 2) in the collector epitaxial layer 24 for the barrier contact. The photoresist layer 26 is exposed to ultraviolet radiation through a photomask 27. The photoresist layer 26 is then developed by an appropriate solvent, such that unmasked portions of the photoresist layer 26 are dissolved and removed, thereby exposing a portion of the collector layer 24.

Figure 2:
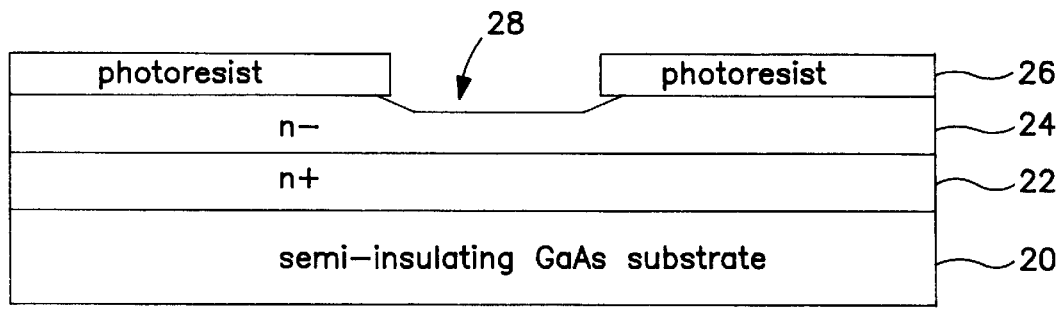
FIG. 2 is similar to FIG. 1 illustrating the formation of a collector via.
Figure 3:
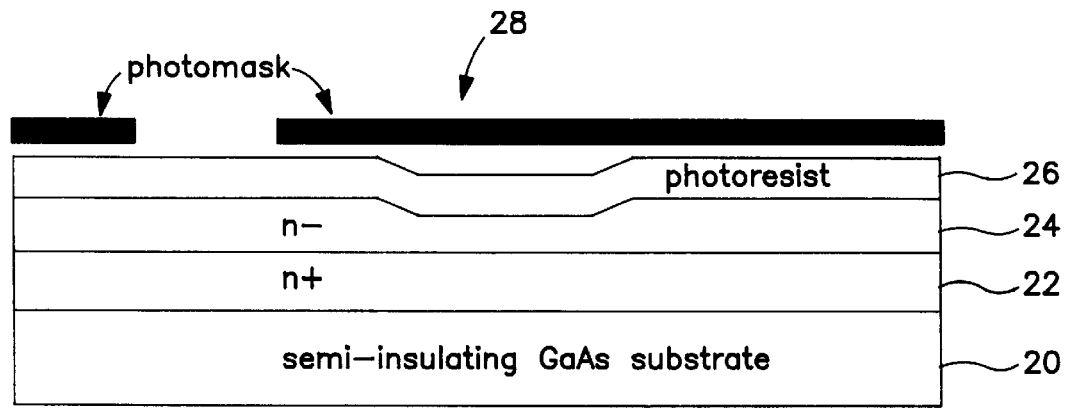
FIG. 3 is similar to FIG. 2 showing a photomask for defining a subcollector via.
Figure 4:
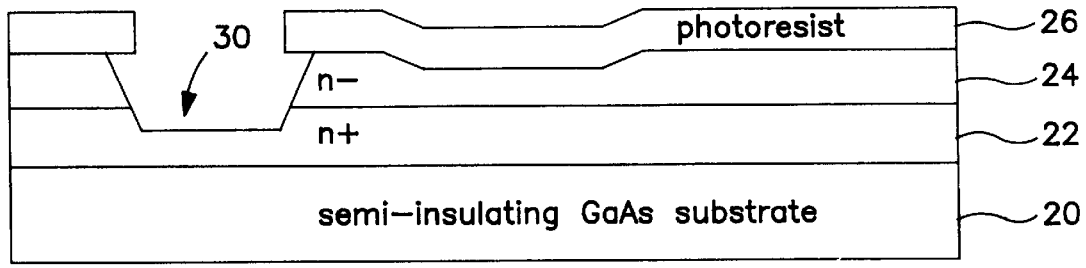
FIG. 4 is similar to FIG. 3 illustrating the formation of a subcollector via.

As shown in FIG. 2, selective wet etching may be used to remove a portion of the collector layer 24 to a depth of 5,000 Å, for example for a 6,000 Å collector layer 24 and 7,000 Å collector contact layer 22 to form the collector via 28. As will be discussed in more detail below, the deep etch into the collector layer 24, shortens the electrical current path in the lighter doped n− collector layer 24 between the higher doped collector n+ contact 42 and the ohmic contacts 40 to thereby lower the series resistance from the n− collector layer 24 and therefore improve the high-frequency cut-off performance.

Figure 5:
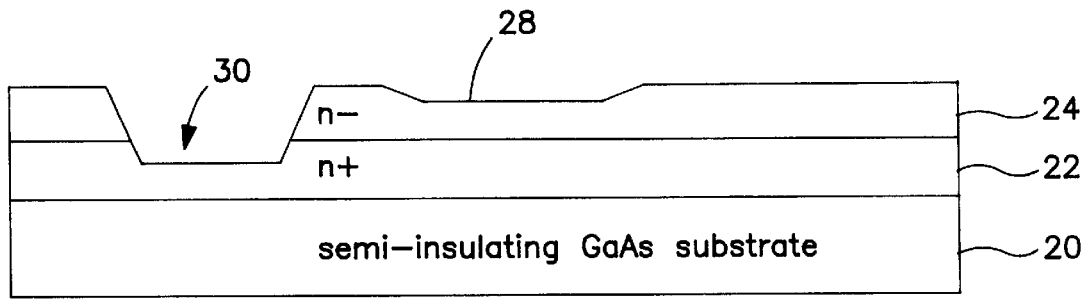
FIG. 5 is similar to FIG. 4 illustrating the removal of a photoresist used in developing the subcollector via.
Figure 6:
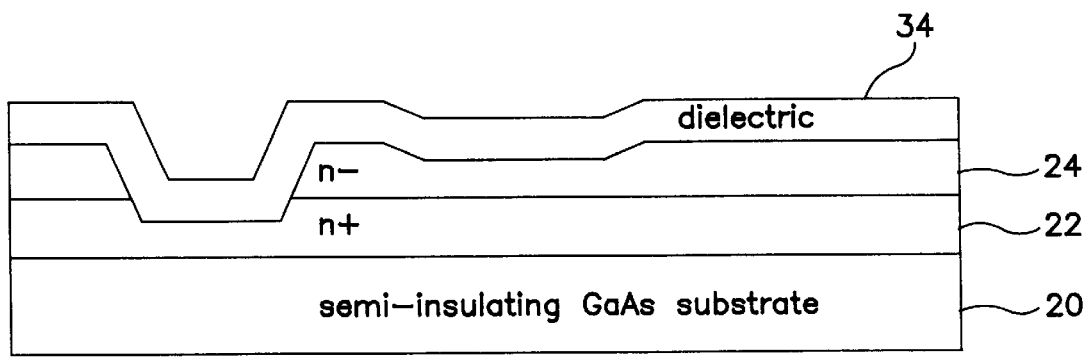
FIG. 6 is similar to FIG. 5 illustrating the deposition of a dielectric.
Figure 7:
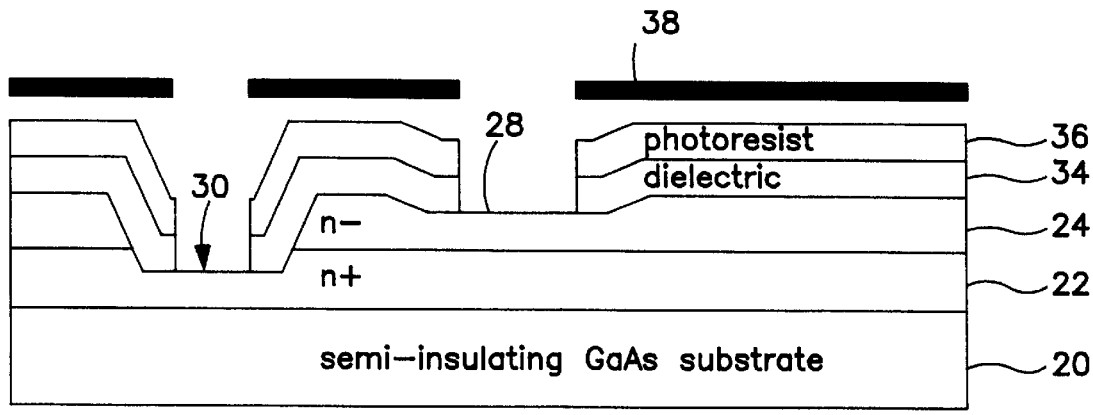
FIG. 7 is similar to FIG. 6 illustrating a photomask for removal of the dielectric material in the wells in the collector and subcollector layers of the barrier and ohmic contacts.
Figure 8:
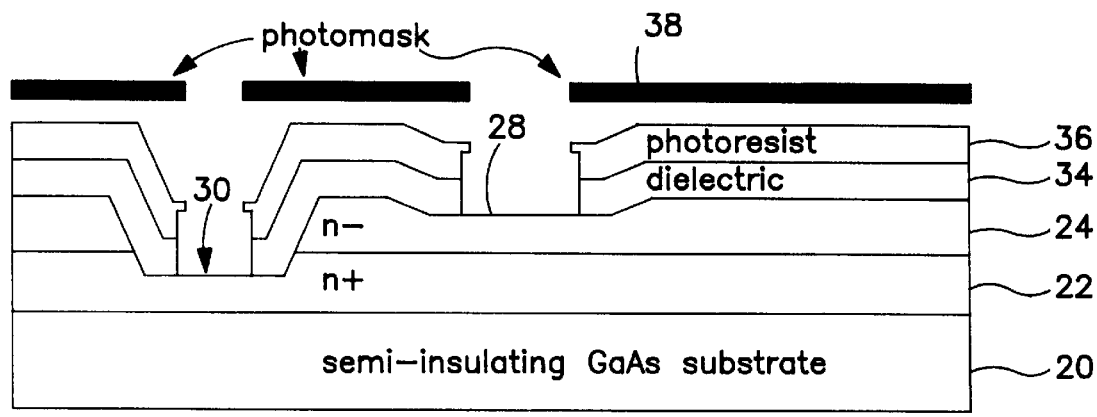
FIG. 8 illustrates the photomask for defining a location of the barrier and ohmic contacts of the Schottky barrier diode in the collector and subcollector.
Figure 9:
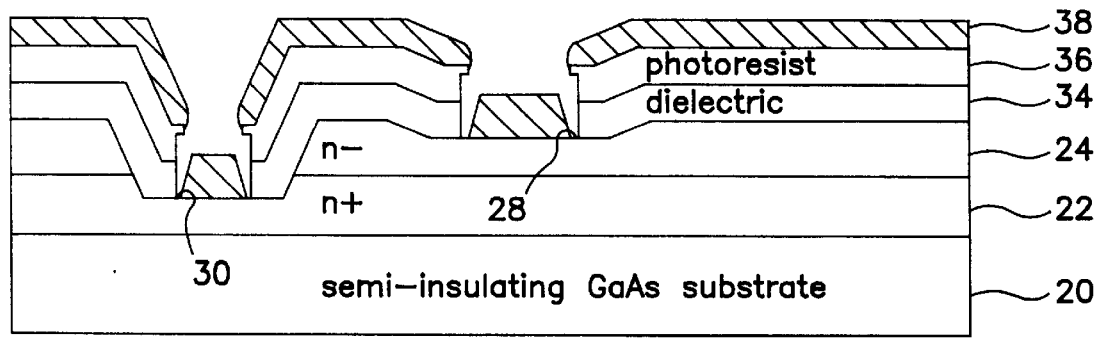
FIG. 9 is similar to FIG. 8 illustrating the deposition of the metal layer.
Figure 10:
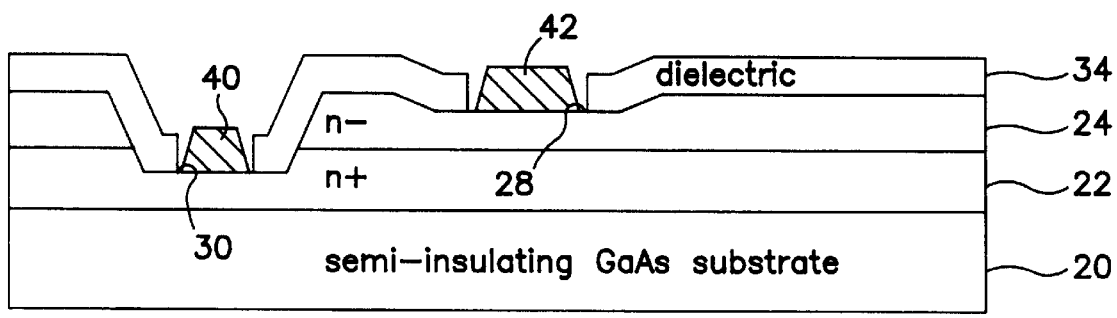
FIG. 10 is similar to FIG. 9 illustrating the removal of the photoresist and metal layer deposited on the photoresist.
Figure 11:
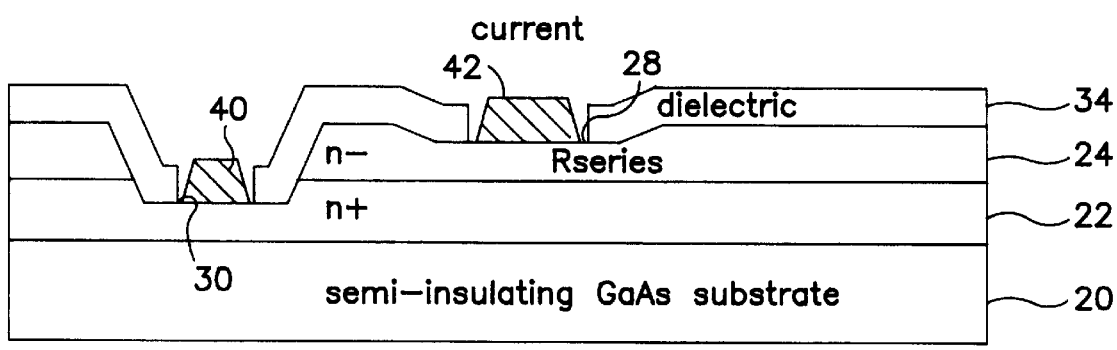
FIG. 11 is similar to FIG. 10, which shows in schematic form the contact resistance between the barrier and ohmic contacts of the Schottky barrier diode.

The collector via 30, which defines the collector contact access, is located by another photomask 32 (FIG. 3), patterned to define the subcollector via 30 (FIG. 4) relative to the subcollector layer 24. The photoresist layer 26 is again exposed to ultraviolet radiation through the photomask 32 and developed by an appropriate solvent, such that the unmasked portions of the photoresist layer 26 are removed, leaving another portion of the collector layer 24 exposed. The subcollector via 30 is then formed by selective wet etching, which etches through the collector layer 24 and relatively deeply into the collector contact layer 22, for example to a depth of 5,000 Å for a 6,000 Å collector 24 and 7,000 Å collector contact 22. After the subcollector via 30 is formed, remaining portions of the photoresist layer 26 are removed with an appropriate solvent, as generally shown in FIG. 5. Once the photoresist layer 26 is removed, a dielectric, for example Silicon Nitride, having a thickness of, for example 2000 Å, is deposited on top of the collector layer 24 and within the collector via 28 and subcollector via 30, as generally shown in FIG. 6. Subsequently, a photoresist layer 36 is spun on top of the dielectric layer 34 as shown in FIG. 7. A photomask 38 is placed over the photoresist layer 36 and patterned to remove portions of the dielectric layer 34 in the subcollector via 28, as well as the collector via 30. The portions of the dielectric layer 34 in the subcollector via 28 and the collector via 30 are then removed by selective wet or dry plasma etching as shown in FIG. 7. Subsequently, as shown in FIG. 8, the photomask 38 is used to develop the photoresist 36 in preparation of the metal evaporation. As shown in FIG. 9, a metal layer 38 is evaporated on top of the developed areas of the photoresist layer 36, as well as in the exposed subcollector layer 22 in the subcollector via 24 and the exposed collective layer 24 in the collector via 28. An appropriate solvent is applied to lift off the photoresist layer 36, as well as the metal layer 38, formed on top of the photoresist layer 36 as shown in FIG. 10. After lift-off, an ohmic contact 40 is formed in the subcollector via 30, while a barrier contact 42 is formed in the collector via 28.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A method for fabricating a Schottky barrier diode comprising the steps of:

(a) providing a structure with a vertically integrated profile of active heterojunction bipolar transistor (HBT) device layers including a substrate layer, a subcollector layer, and a collector layer, one on top of the other;

(b) forming a first photoresist layer on top of said collector layer;

(c) patterning one or more photomasks to define a collector via in said collector layer;

(d) exposing said first photoresist layer through said photomask;

(e) developing said first photoresist layer such that exposed portions of said first photoresist layer are removed, leaving a first portion of said collector layer exposed;

(f) etching said first exposed portion into said collector layer to form a collector via;

(g) removing the remaining first photoresist from said collector layer;

(h) forming a second photoresist layer on top of said collector layer and said collector via;

(i) patterning one or more photomasks to define a subcollector via in said subcollector layer;

(j) developing said second photoresist layer such that an exposed portion of said second photoresist layer is removed leaving a second portion of said collector layer exposed;

(k) etching said second exposed portion through said collector layer and into subcollector layer to form a subcollector via;

(l) removing the remaining second photoresist layer from said collector layer and said subcollector via defining an exposed collector area and an exposed subcollector area in said subcollector via;

(m) depositing a dielectric layer on top of said exposed collector layer, as well as in said collector via and said subcollector via;

(n) depositing a third photoresist layer on top of said dielectric layer, as well as on said exposed collector area in said collector via and said exposed subcollector area in said subcollector via;

(o) removing a portion of said dielectric layer and said third photoresist over said collector via and said subcollector via to expose a portion of said collector layer in said collector via and a portion of said subcollector layer in said subcollector via;

(p) depositing metal onto the remaining portion of said photoresist, as well as onto exposed portions of said collector layer in said collector via and said subcollector layer in said subcollector via; and (q) removing said third photoresist, as well as said metal deposited on said third photoresist, leaving an ohmic contact formed in said subcollector via and a barrier contact formed in said collector via.

2. The method as recited in claim 1, wherein said substrate layer is formed from GaAs.

3. The method as recited in claim 1, wherein said subcollector layer is formed from an n+ material.

4. The method as recited in claim 1, wherein said collector layer is formed from an n− material.

5. The method as recited in claim 1, wherein said substrate layer, subcollector layer and said collector layer are formed by molecular beam epitaxy or metal organic chemical vapor deposition.

6. The method as recited in claim 1, wherein said dielectric is formed from a Silicon Nitride.

7. The method as recited in claim 1, wherein said collector via and said subcollector via are patterned by separate photomasks.

8. A method for fabricating a Schottky barrier diode comprising the steps of:

(a) forming a structure with a vertically integrated profile of active heterojunction bipolar transistor (HBT) device layers including a substrate layer, a subcollector layer and a collector layer, one on top of the other;

(b) forming a subcollector via into said subcollector layer through said collector layer and into said subcollector layer;

(c) forming a collector via into said collector layer;

(d) depositing a dielectric on top of said collector layer, said collector via and said subcollector via;

(e) exposing a portion of said collector via and subcollector via;

(f) forming an ohmic contact on an exposed portion of said subcollector via; and (g) forming a barrier contact on an exposed portion of said collector via.

9. The method as recited in claim 8, wherein said substrate layer is formed from GaAs.

10. The method as recited in claim 8, wherein said subcollector layer is formed from an n+ material.

11. The method as recited in claim 8, wherein said collector layer is formed from an n− material.

12. The method as recited in claim 8, wherein said substrate layer, said subcollector layer and said collector layer are formed by molecular beam epitaxy.

13. The method as recited in claim 8, wherein said subcollector via is formed by etching.

14. The method as recited in claim 8, wherein said collector via is formed by etching.

15. The method as recited in claim 8, wherein said dielectric is Silicon Nitride.

* * * * *